(12) United States Patent
Liu et al.

(10) Patent No.: US 8,592,870 B2
(45) Date of Patent: Nov. 26, 2013

(54) PSEUDO BURIED LAYER AND MANUFACTURING METHOD OF THE SAME, DEEP HOLE CONTACT AND BIPOLAR TRANSISTOR

(75) Inventors: Donghua Liu, Shanghai (CN); Wensheng Qian, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/227,387

(22) Filed: Sep. 7, 2011

(65) Prior Publication Data
US 2012/0056247 A1   Mar. 8, 2012

(30) Foreign Application Priority Data
Sep. 8, 2010   (CN) .......................... 2010 1 0275532

(51) Int. Cl.
| | | |
|---|---|---|
| H01L 31/0328 | (2006.01) | |
| H01L 31/0336 | (2006.01) | |
| H01L 31/072 | (2012.01) | |
| H01L 31/109 | (2006.01) | |
| H01L 29/167 | (2006.01) | |
| H01L 29/207 | (2006.01) | |
| H01L 29/227 | (2006.01) | |
| H01L 31/0288 | (2006.01) | |

(52) U.S. Cl.
USPC .................. 257/197; 257/607; 257/E21.109; 257/E21.147; 257/E29.112; 257/E29.188

(58) Field of Classification Search
USPC ............. 257/E21.537, E21.63, E21.644, 216, 257/349, E29.27, 118, 197, 244, 328–333, 257/466, 513, 594, 607, E21.109, E21.147, 257/E29.112, E29.188; 438/76, 146, 175, 438/262, 282, 370, 526, FOR. 160, 438/FOR. 257, 207, 42, 242–244, 268–274, 438/386–392

See application file for complete search history.

(56) References Cited

U.S. PATENT DOCUMENTS

| | | | | |
|---|---|---|---|---|
| 4,344,081 A | * | 8/1982 | Pao et al. ...................... | 257/378 |
| 4,575,920 A | * | 3/1986 | Tsunashima .................. | 438/297 |
| 4,729,001 A | * | 3/1988 | Haskell ......................... | 257/345 |
| 4,837,173 A | * | 6/1989 | Alvis et al. .................... | 438/303 |
| 4,963,504 A | * | 10/1990 | Huang .......................... | 438/305 |
| 4,975,385 A | * | 12/1990 | Beinglass et al. ............. | 438/304 |
| 5,102,815 A | * | 4/1992 | Sanchez ........................ | 438/305 |
| 5,108,783 A | * | 4/1992 | Tanigawa et al. ............. | 438/359 |
| 5,223,732 A | * | 6/1993 | Clark ............................ | 257/327 |
| 5,324,973 A | * | 6/1994 | Sivan ............................ | 257/330 |
| 5,378,914 A | * | 1/1995 | Ohzu et al. .................... | 257/369 |

(Continued)

Primary Examiner — David S Blum
(74) Attorney, Agent, or Firm — Blakely Sokoloff Taylor & Zafman (57) ABSTRACT

The present invention discloses a pseudo buried layer, a deep hole contact and a bipolar transistor, and also discloses a manufacturing method of a pseudo buried layer, including: etching a silicon substrate to form an active region and shallow trenches; sequentially implanting phosphorous ion and arsenic ion into the bottom of the shallow trenches to form phosphorus impurity regions and arsenic impurity regions; conducting thermal annealing to the phosphorus impurity regions and arsenic impurity regions. The implantation of the pseudo buried layer, adopting phosphorous with rapid thermal diffusion and arsenic with slow thermal diffusion, can improve the impurity concentration on the surface of the pseudo buried layers, reduce the sheet resistance of the pseudo buried layer, form a good ohmic contact between the pseudo buried layer and a deep hole and reduce the contact resistance, and improve the frequency characteristic and current output of triode devices.

11 Claims, 4 Drawing Sheets

(56) References Cited

U.S. PATENT DOCUMENTS

| | | | |
|---|---|---|---|
| 5,442,214 A * | 8/1995 | Yang | 257/328 |
| 5,597,752 A * | 1/1997 | Niwa | 438/291 |
| 5,682,048 A * | 10/1997 | Shinohara et al. | 257/342 |
| 5,728,613 A * | 3/1998 | Hsu et al. | 438/204 |
| 5,817,564 A * | 10/1998 | Church et al. | 438/307 |
| 5,831,288 A * | 11/1998 | Singh et al. | 257/77 |
| 5,874,759 A * | 2/1999 | Park | 257/314 |
| 5,891,776 A * | 4/1999 | Han et al. | 438/274 |
| 5,907,168 A * | 5/1999 | Childs | 257/256 |
| 5,912,493 A * | 6/1999 | Gardner et al. | 257/344 |
| 6,037,633 A * | 3/2000 | Shinohara | 257/342 |
| 6,096,587 A * | 8/2000 | Imoto et al. | 438/191 |
| 6,201,278 B1 * | 3/2001 | Gardner et al. | 257/330 |
| 6,507,073 B1 * | 1/2003 | Hishinuma | 257/356 |
| 6,570,185 B1 * | 5/2003 | Tan | 257/77 |
| 6,773,995 B2 * | 8/2004 | Shin et al. | 438/270 |
| 6,806,153 B2 * | 10/2004 | Wieczorek et al. | 438/301 |
| 6,888,196 B2 * | 5/2005 | Kobayashi | 257/330 |
| 7,439,578 B2 * | 10/2008 | Takeda et al. | 257/328 |
| 7,586,148 B2 * | 9/2009 | Blanchard | 257/328 |
| 7,718,513 B2 * | 5/2010 | Zhu et al. | 438/478 |
| 7,855,384 B2 * | 12/2010 | Yamamoto et al. | 257/77 |
| 7,868,394 B2 * | 1/2011 | Kao | 257/401 |
| 7,948,031 B2 * | 5/2011 | Otake et al. | 257/335 |
| 7,999,312 B2 * | 8/2011 | Takaya et al. | 257/331 |
| 8,003,456 B2 * | 8/2011 | Chiola et al. | 438/206 |
| 2002/0160562 A1 * | 10/2002 | Babcock et al. | 438/207 |
| 2003/0207504 A1 * | 11/2003 | Fuselier et al. | 438/151 |
| 2005/0230745 A1 * | 10/2005 | Fatemizadeh et al. | 257/330 |
| 2006/0071217 A1 * | 4/2006 | Ohyanagi et al. | 257/77 |
| 2006/0292805 A1 * | 12/2006 | Kawamura et al. | 438/292 |
| 2007/0007571 A1 * | 1/2007 | Lindsay et al. | 257/306 |
| 2007/0082448 A1 * | 4/2007 | Kim et al. | 438/268 |
| 2007/0108555 A1 * | 5/2007 | Lenoble et al. | 257/592 |
| 2007/0114599 A1 * | 5/2007 | Hshieh | 257/330 |
| 2007/0145492 A1 * | 6/2007 | Choi | 257/383 |
| 2008/0048186 A1 * | 2/2008 | Cheng et al. | 257/48 |
| 2008/0054326 A1 * | 3/2008 | Wong et al. | 257/300 |
| 2008/0160697 A1 * | 7/2008 | Kao | 438/268 |
| 2008/0211064 A1 * | 9/2008 | Orner et al. | 257/622 |
| 2008/0217693 A1 * | 9/2008 | Wang et al. | 257/352 |
| 2008/0242039 A1 * | 10/2008 | Ku et al. | 438/305 |
| 2009/0179228 A1 * | 7/2009 | Joseph et al. | 257/197 |
| 2009/0194811 A1 * | 8/2009 | Pan et al. | 257/330 |
| 2009/0212363 A1 * | 8/2009 | Krivokapic | 257/347 |
| 2009/0289305 A1 * | 11/2009 | Majumdar et al. | 257/351 |
| 2010/0006929 A1 * | 1/2010 | Andou | 257/330 |
| 2010/0032804 A1 * | 2/2010 | Balster et al. | 257/586 |
| 2010/0078707 A1 * | 4/2010 | Haeberlen et al. | 257/328 |
| 2010/0148274 A1 * | 6/2010 | Tai et al. | 257/369 |
| 2010/0163975 A1 * | 7/2010 | Hshieh | 257/330 |
| 2010/0271524 A1 * | 10/2010 | Venezia et al. | 348/308 |
| 2011/0018608 A1 * | 1/2011 | Chi et al. | 327/479 |
| 2011/0068398 A1 * | 3/2011 | Anderson et al. | 257/347 |
| 2011/0140239 A1 * | 6/2011 | Chiu et al. | 257/565 |
| 2011/0156135 A1 * | 6/2011 | Yoon et al. | 257/330 |
| 2011/0156202 A1 * | 6/2011 | Chiu et al. | 257/526 |
| 2011/0233606 A1 * | 9/2011 | Hsieh | 257/139 |
| 2011/0254015 A1 * | 10/2011 | Doris et al. | 257/77 |
| 2011/0284953 A1 * | 11/2011 | Long et al. | 257/331 |

\* cited by examiner

PSEUDO BURIED LAYER AND MANUFACTURING METHOD OF THE SAME, DEEP HOLE CONTACT AND BIPOLAR TRANSISTOR

CROSS-REFERENCES TO RELATED APPLICATIONS

This application claims the priority of Chinese patent application number 201010275532.8, filed on Sep. 8, 2010, the entire contents of which are incorporated herein by reference.

FIELD OF THE INVENTION

The present invention relates to the field of semiconductor integrated circuit manufacturing and, more particularly, to a manufacturing method of pseudo buried layers in a SiGe bipolar CMOS process. The present invention also relates to a pseudo buried layer, a deep hole contact, and a bipolar transistor.

BACKGROUND

Figure 1:
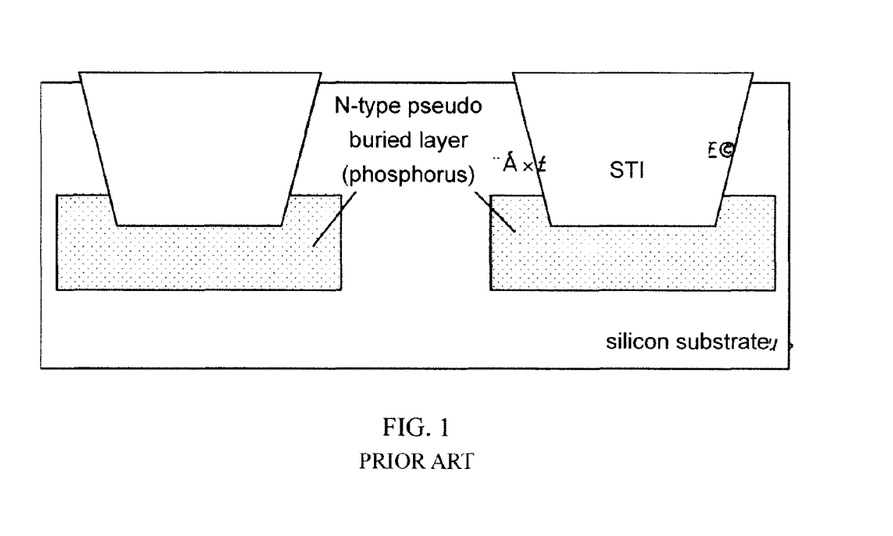
FIG. 1 is a schematic diagram showing the structure of N-type pseudo buried layers in the prior art.

In a SiGe bipolar CMOS (SiGe BiCMOS) process, deep hole contact process and pseudo buried layers are used to fabricate devices with small-area and low-cost. FIG. 1 is a schematic diagram showing the structure of N-type pseudo buried layers in the prior art. As shown in FIG. 1, shallow trench isolations (STI) and an active region are formed in a silicon substrate. The shallow trench isolations, namely shallow trench field oxides, are formed through etching the silicon substrate to form shallow trenches and filing silicon oxide into the shallow trenches. Conventional N-type pseudo buried layers are constituted by phosphorus impurity regions formed at the bottom of the STIs in the silicon substrate, and the phosphorus impurity regions are formed through phosphorus ion implantation into the bottom of the shallow trenches and thermal annealing thereafter. Through the thermal annealing, the phosphorus impurity regions extend laterally and vertically into the active region and into deeper parts of the silicon substrate away from the bottom of the shallow trenches.

Conventional deep hole contacts are formed in the STIs on the top of the pseudo buried layers, and the process for forming deep hole contacts includes: forming deep holes in the STIs, depositing Ti/TiN barrier metal layers in the deep holes, and then filing tungsten into the deep holes. Therefore, in the prior art, the metal in the deep holes directly contacts with the silicon, namely the pseudo buried layers at the bottom of the shallow trenches, and it is difficult to introduce metal silicide process into the manufacturing process. Meanwhile, in the SiGe BiCMOS process in the prior art, the N-type pseudo buried layers need to have a certain horizontal and vertical diffusion to meet the performance requirements of heterojunction bipolar transistors (HBT). Therefore, phosphorus is often used as the impurity implanted for the N-type pseudo buried layers due to its property of fast lateral diffusion. As conventional N-type pseudo buried layers are implanted at the early stage of the BiCMOS process, the phosphorus impurities are activated by almost all the thermal treatments throughout the BiCMOS process, which helps to satisfy the lateral diffusion requirement of the N-type pseudo buried layers, but also leads to a too low impurity concentration on the surface of the N-type pseudo buried layers, and hence a too high contact resistance between the N-type pseudo buried layers and the deep hole contacts; in some cases, it even fails to form an effective ohmic contact. Furthermore, the too low impurity concentration will also increase the sheet resistance of the N-type pseudo buried layers.

BRIEF SUMMARY OF THE DISCLOSURE

An objective of the invention is to provide a manufacturing method of a pseudo buried layer to improve the impurity concentration on the surface of the pseudo buried layer, reduce the sheet resistance of the pseudo buried layer, as well as form a good ohmic contact and reduce the contact resistance between the pseudo buried layer and the deep hole contact. To achieve the above objective, the present invention also provides a pseudo buried layer, a deep hole contact, and a bipolar transistor for improving the frequency characteristic and current output performance of the device.

To achieve the above objective, the invention provides a manufacturing method of pseudo buried layers, comprises the following steps:

step 1: etching a silicon substrate to form an active region and shallow trenches;

step 2: implanting phosphorous ion into the bottom of the shallow trenches to form phosphorus impurity regions;

step 3: implanting arsenic ion into the bottom of the shallow trenches to form arsenic impurity regions;

step 4: conducting thermal annealing to the phosphorus impurity regions and the arsenic impurity regions.

In one embodiment of the invention, the dosage of the phosphorous ion implantation is $1e14\ cm^{-2} \sim 1e16\ cm^{-2}$ and the implantation energy is 3 keV~30 keV in step 2; the dosage of the arsenic ion implantation is $1e15\ cm^{-2} \sim 1e16\ cm^{-2}$ and the implantation energy is 5 keV~30 keV in step 3.

In one embodiment of the invention, the diffusion rate of phosphorous ions is higher than that of arsenic ions during the thermal annealing process in step 4, and after the thermal annealing process, the phosphorus impurity regions have a larger coverage area than that of the arsenic impurity regions; the arsenic impurity regions are retained at the bottom of the shallow trenches; the phosphorus impurity regions extend laterally into the active region and vertically into the silicon substrate away from the bottom of the shallow trenches; and the concentration of the arsenic impurity regions is higher than that of the phosphorus impurity regions.

The invention also provides a pseudo buried layer, which is formed at the bottom of a shallow trench in a silicon substrate, comprises a phosphorus impurity region and an arsenic impurity region; wherein, the phosphorus impurity region has a larger coverage area than the arsenic impurity region; the arsenic impurity region is formed at the bottom of the shallow trench; the phosphorus impurity region extends laterally into an active region and vertically into the silicon substrate away from the bottom of the shallow trench; and the concentration of the arsenic impurity region is higher than that of the phosphorus impurity region.

In one embodiment of the invention, the phosphorus impurity region is formed through phosphorus ion implantation into the bottom of the shallow trench and thermal annealing thereafter, and the arsenic impurity region is formed through arsenic ion implantation into the bottom of the shallow trench and thermal annealing thereafter.

In one embodiment of the invention, the dosage of the phosphorous ion implantation is $1e14\ cm^{-2} \sim 1e16\ cm^{-2}$ and the implantation energy is 3 keV~30 keV; the dosage of arsenic ion implantation is $1e15\ cm^{-2} \sim 1e16\ cm^{-2}$ and the implantation energy is 5 keV~30 keV.

The invention also provides a deep hole contact, the deep hole contact comprises a metal formed in a deep hole and contacting with a pseudo buried layer, wherein, the deep hole is formed in a shallow trench field oxide on the top of the pseudo buried layer; the pseudo buried layer is formed at the bottom of a shallow trench in a silicon substrate and comprises a phosphorus impurity region and an arsenic impurity region; the phosphorus impurity region has a larger coverage area than the arsenic impurity region; the arsenic impurity region is formed at the bottom of the shallow trench; the phosphorus impurity region extends laterally into an active region and vertically into the silicon substrate away from the bottom of the shallow trench; the concentration of the arsenic impurity region is higher than that of the phosphorus impurity region; an ohmic contact is formed between the metal in the deep hole and the arsenic impurity region.

In one embodiment of the invention, the phosphorus impurity region is formed through phosphorus ion implantation into the bottom of the shallow trench and thermal annealing thereafter, and the arsenic impurity region is formed through arsenic ion implantation into the bottom of the shallow trench and thermal annealing thereafter.

In one embodiment of the invention, the dosage of the phosphorous ion implantation is $1e14$ $cm^{-2}$~$1e16$ $cm^{-2}$ and the implantation energy is 3 keV~30 keV; the dosage of arsenic ion implantation is $1e15$ $cm^{-2}$~$1e16$ $cm^{-2}$ and the implantation energy is 5 keV~30 keV.

In one embodiment of the invention, the metal in the deep hole comprising a Ti/TiN barrier metal layer and tungsten, wherein, the Ti/TiN barrier metal layer is formed on the inside wall and bottom of the deep hole, and the tungsten is formed on the Ti/TiN barrier metal layer and fills the deep hole.

The invention also provides a bipolar transistor, whose N-type region is formed in an active region in a silicon substrate and connects to pseudo buried layers and is picked up through deep hole contacts, wherein, each of the pseudo buried layers is formed in the silicon substrate at the bottom of a shallow trench adjacent to the active region and comprises a phosphorus impurity region and an arsenic impurity region; the coverage of the phosphorus impurity region is larger than that of the arsenic impurity region; the arsenic impurity region is formed at the bottom of the shallow trench; the phosphorus impurity region extends laterally into the active region and vertically into a bottom part of the silicon substrate away from the bottom of the shallow trench; the concentration of the arsenic impurity region is larger than that of the phosphorus impurity region; the N-type region is connected with the phosphorus impurity regions; each of the deep hole contacts comprises metal in a deep hole formed in the shallow trench isolation on the top of the pseudo buried layer, the metal in the deep hole contacts with the pseudo buried layer, and the metal forms an ohmic contact with the arsenic impurity region.

In one embodiment of the invention, the phosphorus impurity region is formed through phosphorus ion implantation into the bottom of the shallow trench and thermal annealing thereafter, and the arsenic impurity region is formed through arsenic ion implantation into the bottom of the shallow trench and thermal annealing thereafter.

In one embodiment of the invention, the dosage of the phosphorous ion implantation is $1e14$ $cm^{-2}$~$1e16$ $cm^{-2}$ and the implantation energy is 3 keV~30 keV; the dosage of arsenic ion implantation is $1e15$ $cm^{-2}$~$1e16$ $cm^{-2}$ and the implantation energy is 5 keV~30 keV.

In one embodiment of the invention, the bipolar transistor is a SiGe NPN heterojunction transistor, whose collector region is the N-type region.

The manufacturing method of a pseudo buried layer of the present invention can improve the impurity concentration on the surface of the pseudo buried layer, reduce the sheet resistance of pseudo buried layer, form a good ohmic contact and reduce contact resistance between the pseudo buried layer and the deep hole contact. The bipolar transistor of the present invention can improve the frequency characteristic, current output performance and power gain of the device and meanwhile do not affect the current gain coefficient of the device.

BRIEF DESCRIPTION OF THE DRAWINGS

The present invention is further detailed by embodiments in combination with the following drawings.

DETAILED DESCRIPTION

Figure 2:
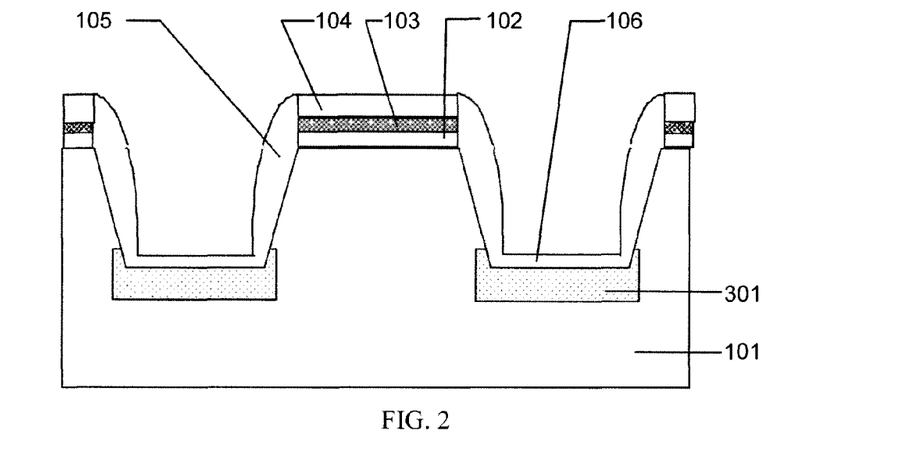
FIGS. 2-4 are schematic diagrams showing the structure of the device in the manufacturing method of the pseudo buried layers in an embodiment of the present invention.
Figure 3:
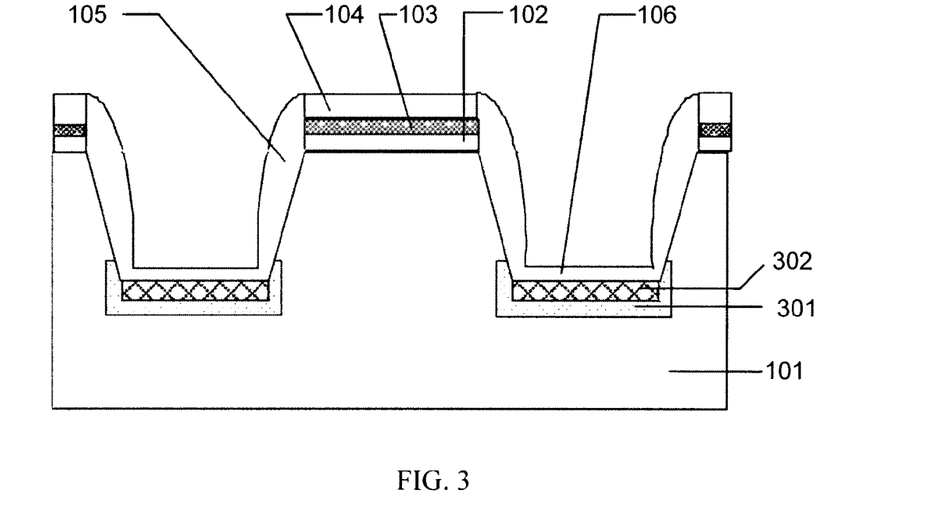
Figure 4:
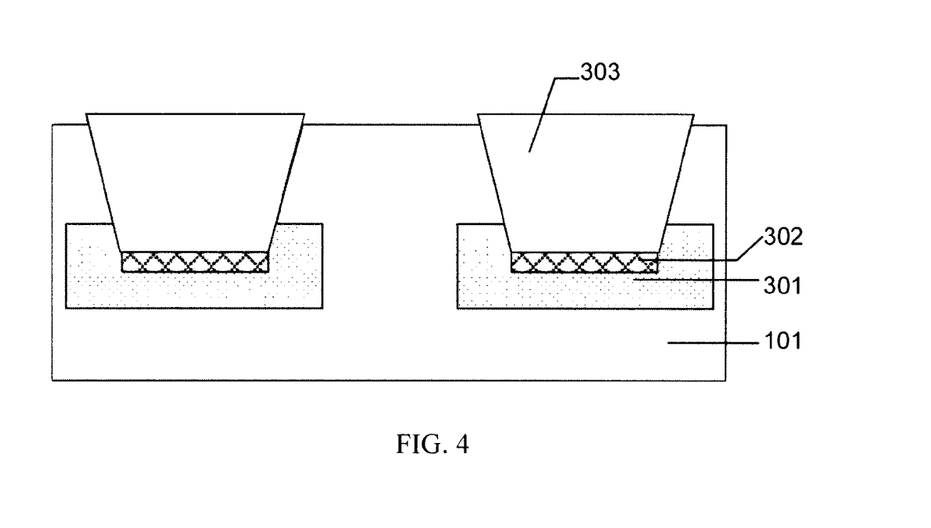

FIGS. 2-4 are schematic diagrams showing the structure of a device in the manufacturing method of pseudo buried layers in an embodiment of the present invention. As shown in FIGS. 2-4, the manufacturing method of the pseudo buried layers includes the following steps:

Step 1: as shown in FIG. 2, an active region and shallow trenches are formed in a silicon substrate 101 through etching the silicon substrate 101. And a first silicon oxide layer 102, a silicon nitride layer 103, and a second silicon oxide layer 104 are formed on the surface of the active region. Meanwhile, sidewall silicon oxide layers 105 and a bottom silicon oxide layer 106 are formed on the side walls and the bottom of the respective shallow trench. All the silicon oxide layers and silicon nitride layers are used as protective layers for the active region to prevent ions being implanted into the active region in the subsequent processes of ion implantation into the bottom of the shallow trenches.

Step 2: as shown in FIG. 2, phosphorus impurity regions 301 are formed through phosphorous ion implantation into the bottom of the shallow trenches. And the dosage of the phosphorous ion implantation is $1e14$ $cm^{-2}$~$1e16$ $cm^{-2}$, and the implantation energy is 3 keV~30 keV.

Step 3: as shown in FIG. 3, arsenic impurity regions 302 are formed through arsenic ion implantation into the bottom of the shallow trenches. And the dosage of the arsenic ion implantation is $1e15$ $cm^{-2}$~$1e16$ $cm^{-2}$, and the implantation energy is 5 keV~30 keV. It is shown from the figure that each arsenic impurity region 302 is overlapped with the corresponding phosphorus impurity region 301; therefore, the arsenic impurity regions 302 contain phosphorous impurities. Since the phosphorus impurities have higher thermal diffusion rate than that of the arsenic impurities, during the subsequent thermal processes, the distribution of phosphorus impurities in the regions 301 become deeper due to the result of thermal diffusion. And then, as shown in FIG. 4, remove the first silicon oxide layer 102, the silicon nitride layer 103, and the second silicon oxide layer 104 formed on the surface of the active region as well as the sidewall silicon oxide layers 105 and the bottom silicon oxide layers 106 formed on the sidewalls and the bottoms of the shallow trenches.

Step 4: as shown in FIG. 4, shallow trench field oxides, namely shallow trench isolations (STI) 303, are formed through filling silicon oxide into the shallow trenches. And then, thermal annealing is applied to the phosphorus impurity regions 301 and the arsenic impurity regions 302 to cause the impurities to diffuse. A separate thermal annealing step can be conducted to activate the impurities or such a step could be omitted as the diffusion of impurities could be completed in the thermal treatments to be conducted in subsequent processes. As phosphorous ions have a property of rapid thermal diffusion, while arsenic ions have a property of slow thermal diffusion, the diffusion rate of phosphorous ions will be much higher than that of arsenic ions during a thermal annealing process. Therefore, after the thermal annealing process, the coverage area of the phosphorus impurity regions 301 are larger than that of the arsenic impurity regions 302; and the arsenic impurity regions 302 are retained at the bottom of the shallow trenches, while the phosphorus impurity regions 301 extend laterally into the active region and vertically into the deeper parts of the silicon substrate 101 away from the bottom of the shallow trenches. And the concentration of the arsenic impurity regions 302 is larger than that of the phosphorus impurity regions 301.

The pseudo buried layers in the embodiment of the present invention are formed after completing the above steps.

Figure 5:
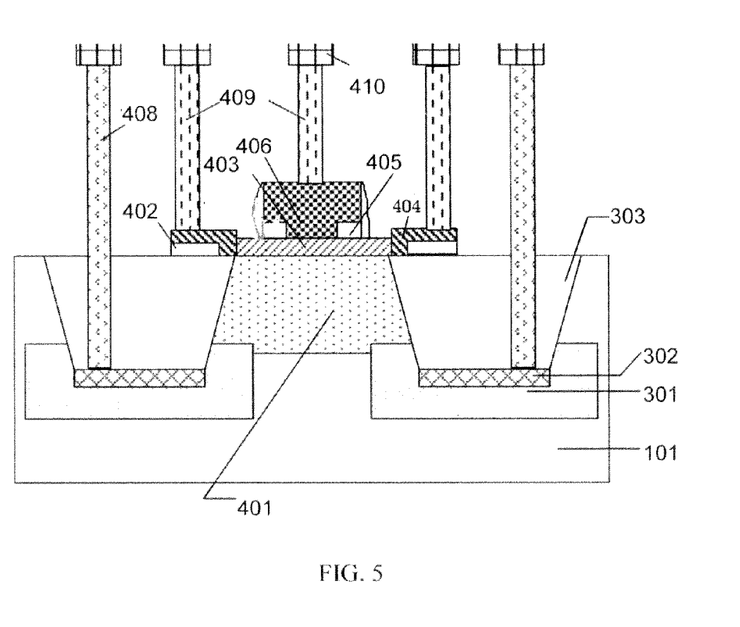
FIG. 5 is a schematic diagram showing the structure of the triode device in an embodiment of the present invention.

FIG. 5 is a schematic diagram showing the structure of the bipolar transistor in an embodiment of the present invention, wherein the bipolar transistor is a SiGe NPN heterojunction transistor. The SiGe NPN heterojunction triode can be formed through conventional SiGe bipolar CMOS processes based on the above-mentioned four steps. In the bipolar transistor of the embodiment of the present invention, a collector region 401 is formed in the active region and contacts with the arsenic impurity regions 302 which extend into the active region. And the collector region 401 is picked up through deep hole contacts 408 connected with the pseudo buried layers. The deep hole contacts 408 include metal in deep holes formed in the STIs 303 on the top of the pseudo buried layers. And the metal in each deep hole contacts with the respective pseudo buried layer, and the metal forms an ohmic contact with the respective arsenic impurity region 302. The metal in each deep hole includes Ti/TiN barrier metal layers and tungsten, wherein the Ti/TiN barrier metal layers are formed on the inside wall and bottom of the deep hole and the tungsten is formed on the Ti/TiN barrier metal layers and fill the deep hole.

As shown in FIG. 5, the bipolar transistor of the embodiment of the present invention also includes a base region 403 and an emitter region 406. The base region 403 consists of a P-type epitaxial layer on top of the active region and contacts with the collector region 401. Both sides of the base region 403 are also connected with extrinsic base regions 404 to be picked up through metal contacts 409. The extrinsic base regions 404 are isolated from the STIs 303 by base region isolating field oxides 402. The emitter region 406 consists of N-type polysilicon formed on the base region 403 and contacts the base region 403.

An upper part of the emitter region 406 extends laterally in both sides and forms extension parts above the base region 403. The extension parts are isolated from the base region 403 by emitter polysilicon isolating oxides 405. The emitter region 406 is picked up through a metal contact 409. And finally, all the metal contacts 409 and the deep hole contacts 408 are connected to a metal wire 410 to connect all the devices.

Figure 6:
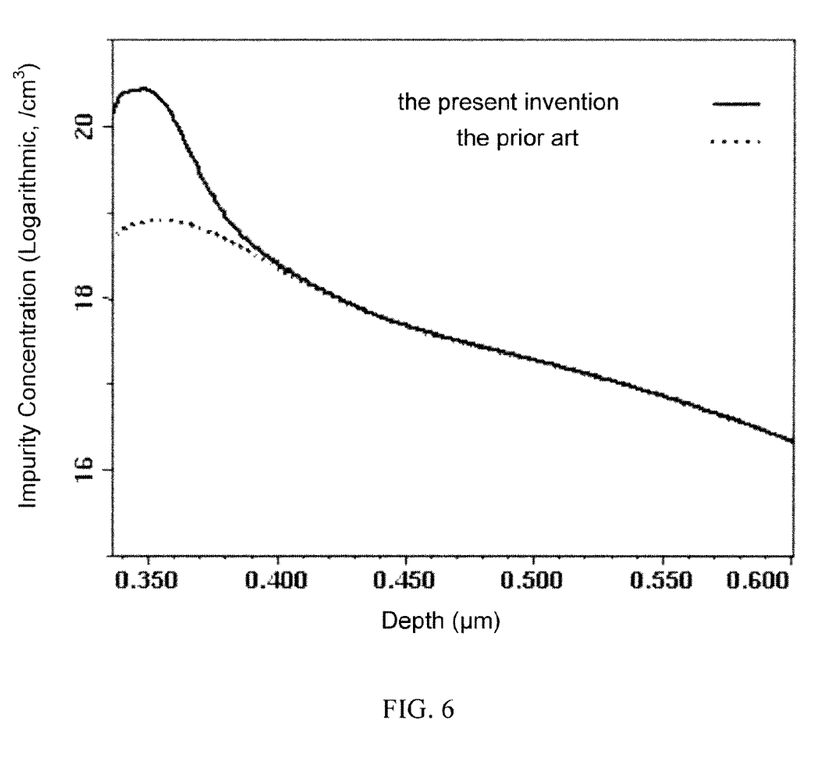
FIG. 6 is a schematic diagram showing the impurity distribution of the N-type pseudo buried layers in the prior art and in an embodiment of the present invention.

FIG. 6 is a schematic diagram showing the impurity distribution of the N-type pseudo buried layers in the prior art and in an embodiment of the present invention. In FIG. 6, the lateral axis represents the vertical depth of the pseudo buried layers, i.e., the vertical depth from the bottom of the STIs toward the bottom of the silicon substrate, wherein the '0.35 µm' represents the vertical depth coordinate of the surface of active region. The vertical axis in FIG. 6 represents the impurity concentration at each position of the pseudo buried layers. It could be found from FIG. 6 that the impurity concentration of the pseudo buried layers at the bottom of the STIs of the present invention is greatly increased. This high concentration provides a technical assurance for reducing the sheet resistance of the pseudo buried layers and forming a good ohmic contact between the pseudo buried layers and the deep hole contacts.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A pseudo buried layer, which is formed at the bottom of a shallow trench in a silicon substrate, comprising:
a first N type region and a second N type region, the first N type region being doped with an impurity of phosphorus, the second N type region being doped with an impurity of arsenic; wherein,
the first N type region has a larger coverage area than the second N type region;
the second N type region is formed at the bottom of the shallow trench;
the first N type region extends laterally into an active region and vertically into the silicon substrate away from the bottom of the shallow trench; and
the concentration of the second N type region is larger than that of the first N type region.

2. The pseudo buried layer according to claim 1, wherein, the first N type region is formed through phosphorus ion implantation into the bottom of the shallow trench and thermal annealing thereafter, and
the second N type region is formed through arsenic ion implantation into the bottom of the shallow trench and thermal annealing thereafter.

3. The pseudo buried layer according to claim 2, wherein, the dosage of the phosphorous ion implantation is 1e14 $cm^{-2}$~1e16 $cm^{-2}$ and the implantation energy is 3 keV~30 keV;
the dosage of arsenic ion implantation is 1e15 $cm^{-2}$~1e16 $cm^{-2}$ and the implantation energy is 5 keV~30 keV.

4. A deep hole contact, comprising a metal formed in a deep hole and contacting with a pseudo buried layer, wherein,
the deep hole is formed in a shallow trench field oxide on the top of the pseudo buried layer;
the pseudo buried layer is formed at the bottom of a shallow trench in a silicon substrate and comprises a phosphorus impurity region and an arsenic impurity region;
the phosphorus impurity region has a larger coverage area than the arsenic impurity region;
the arsenic impurity region is formed at the bottom of the shallow trench;
the phosphorus impurity region extends laterally into an active region and vertically into the silicon substrate away from the bottom of the shallow trench;
the concentration of the arsenic impurity region is larger than that of the phosphorus impurity region;
an ohmic contact is formed between the metal in the deep hole and the arsenic impurity region.

5. The deep hole contact according to claim 4, wherein,
the phosphorus impurity region is formed through phosphorus ion implantation into the bottom of the shallow trench and thermal annealing thereafter, and
the arsenic impurity region is formed through arsenic ion implantation into the bottom of the shallow trench and thermal annealing thereafter.

6. The deep hole contact according to claim 5, wherein,
the dosage of the phosphorous ion implantation is 1e14 cm$^{-2}$~1e16 cm$^{-2}$ and the implantation energy is 3 keV~30 keV;
the dosage of arsenic ion implantation is 1e15 cm$^{-2}$~1e16 cm$^{-2}$ and the implantation energy is 5 keV~30 keV.

7. The deep hole contact according to claim 4,
the metal in the deep hole comprising a Ti/TiN barrier metal layer and tungsten, wherein,
the Ti/TiN barrier metal layer is formed on the inside wall and bottom of the deep hole, and
the tungsten is formed on the Ti/TiN barrier metal layer and fills the deep hole.

8. A bipolar transistor, whose N-type region is formed in an active region in a silicon substrate and connects to pseudo buried layers and is picked up through deep hole contacts, wherein, the pseudo buried layers are formed in the silicon substrate at the bottom of shallow trenches adjacent to the active region and each comprises:
a first N type portion and a second N type portion, the first N type portion being doped with an impurity of phosphorus, the second N type portion being doped with an impurity of arsenic, wherein the first N type portion and the second N type portion each have a coverage area;
wherein, the coverage area of the first N type portion is larger than that of the second N type portion;
the second N type portion is formed at the bottom of the respective shallow trench;
the first N type portion extends laterally into the active region and vertically into the silicon substrate away from the bottom of the shallow trench; and
the concentration of the second N type portion is larger than that of the first N type portion;
the N-type region is connected with the first N type portion;
each of the deep hole contacts comprises a metal in a deep hole formed in a shallow trench isolation on the top of the respective pseudo buried layer, the metal in the deep hole contacts with the respective pseudo buried layer, and the metal forms an ohmic contact with the respective second N type portion.

9. The bipolar transistor according to claim 8, wherein,
the first N type portion is formed through phosphorus ion implantation into the bottom of the shallow trench and thermal annealing thereafter, and
the second N type portion is formed through arsenic ion implantation into the bottom of the shallow trench and thermal annealing thereafter.

10. The bipolar transistor according to claim 9, wherein, the dosage of the phosphorous ion implantation is 1e14 cm$^{-2}$~1e16 cm$^{-2}$ and the implantation energy is 3 keV~30 keV; the dosage of arsenic ion implantation is 1e15 cm$^{-2}$~1e16 cm$^{-2}$ and the implantation energy is 5 keV~30 keV.

11. The bipolar transistor according to claim 8, wherein the device is a SiGe NPN heterojunction transistor, whose collector region being the N-type region.

* * * * *

UNITED STATES PATENT AND TRADEMARK OFFICE
CERTIFICATE OF CORRECTION

PATENT NO. : 8,592,870 B2  
APPLICATION NO. : 13/227387  
DATED : November 26, 2013  
INVENTOR(S) : Donghua Liu and Wensheng Qian Page 1 of 1

It is certified that error appears in the above-identified patent and that said Letters Patent is hereby corrected as shown below:

In the Claims, Column 8, Claim 11, line 31, please delete "device" and insert --transistor--.

Signed and Sealed this
Twenty-second Day of July, 2014

Michelle K. Lee
*Deputy Director of the United States Patent and Trademark Office*